(12) United States Patent
Milor

(10) Patent No.: US 6,448,098 B1
(45) Date of Patent: Sep. 10, 2002

(54) DETECTION OF UNDESIRED CONNECTION BETWEEN CONDUCTIVE STRUCTURES WITHIN MULTIPLE LAYERS ON A SEMICONDUCTOR WAFER

(75) Inventor: Linda S. Milor, Berkeley, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/495,844

(22) Filed: Feb. 1, 2000

Related U.S. Application Data

(62) Division of application No. 09/353,266, filed on Jul. 14, 1999.

(51) Int. Cl.[7] ............................................... G01R 31/26
(52) U.S. Cl. ............................. 438/17; 438/14; 438/15; 438/16; 438/18; 257/48; 257/797; 257/401; 324/765; 324/763
(58) Field of Search ............................. 438/5, 6, 7, 10, 438/11, 14, 15, 16, 17, 18, 128, 466, 384, 107, 210, 257, 773, 776, 324, 763, 765, 381; 257/48, 797, 401, 776, 773; 324/765, 763

(56) References Cited

U.S. PATENT DOCUMENTS

| | | | | |
|---|---|---|---|---|
| 4,984,061 A | * | 1/1991 | Matsumoto | 257/776 |
| 5,699,282 A | * | 12/1997 | Allen et al. | 702/85 |
| 5,821,759 A | * | 10/1998 | Scaman et al. | 324/529 |
| 5,877,033 A | * | 3/1999 | Matern | 438/14 |
| 5,918,107 A | * | 6/1999 | Fogal et al. | 438/15 |

\* cited by examiner

Primary Examiner—Wael Fahmy
Assistant Examiner—Julio J. Maldonado
(74) Attorney, Agent, or Firm—Monica H. Choi

(57) ABSTRACT

The present invention is a device and method for detecting undesired connection between conductive structures within multiple layers on a semiconductor wafer during fabrication of an integrated circuit on the semiconductor wafer. The present invention includes a first conductive structure fabricated within a first layer on the semiconductor wafer and a second conductive structure fabricated within a second layer on the semiconductor wafer. The present invention also includes an interlevel of an insulating material disposed between the first layer and the second layer for separating the first layer from the second layer. The present invention further includes a contact structure of conductive material disposed within the interlevel of the insulating material. The contact structure is connected to the first conductive structure, and the contact structure becomes undesirably connected to the second conductive structure from at least one of: sufficient misalignment of at least one of the first layer, the second layer, and the interlevel of insulating material; sufficient proximity effect on at least one of the first conductive structure, the second conductive structure, and the contact structure; and sufficient defects in at least one of the second layer and the interlevel of insulating material. In addition, the present invention includes a detector for determining when the contact structure is undesirably connected to the second conductive structure. The first conductive structure may have a comb structure with a respective contact structure connected to each tooth of the comb structure. In that case, the second conductive structure surrounds three sides of the respective contact structure.

8 Claims, 6 Drawing Sheets

DETECTION OF UNDESIRED CONNECTION BETWEEN CONDUCTIVE STRUCTURES WITHIN MULTIPLE LAYERS ON A SEMICONDUCTOR WAFER

This is a divisional of an earlier filed copending patent application, with Ser. No. 09/353,266 filed on Jul. 14, 1999, for which priority is claimed. This earlier filed copending patent application with Ser. No. 09/353,266 is in its entirety incorporated herewith by reference.

TECHNICAL FIELD

This invention relates to integrated circuit fabrication, and more particularly to a mechanism for detecting undesired connection between conductive structures within multiple layers on a semiconductor wafer during fabrication of an integrated circuit.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die potentially leads to a higher number of operational IC die fabricated on a semiconductor wafer. Such advantages are a driving force to constantly scale down IC dimensions.

In addition, as IC dimensions are scaled down, multiple layers of conductive structures (such as metal lines for example) are used since stacking of the metal lines leads to a more compact integrated circuit on a semiconductor wafer. As IC dimensions are further scaled down, the integrated circuit is designed with smaller space that separates the structures of the multiple layers on a semiconductor wafer. However, interference and diffusion effects during photolithography processes for patterning these structures of the multiple layers on the semiconductor wafer may make these structures larger. Thus, as IC dimensions are further scaled down, misalignment between the multiple layers of conductive structures results in higher probability of undesired overlap and contact between conductive structures of multiple layers on the semiconductor wafer.

Referring to FIG. 1A, a cross sectional view is shown of multiple layers of metal lines on a semiconductor wafer 102. A top metal line 104 is within a top layer, and a bottom metal line 106 is within a bottom layer that is adjacent a layer of insulating material 108 that is deposited on the semiconductor wafer 102. The top metal line 104 is typically surrounded by a first insulating material 110 within the top layer. The bottom metal line 106 is also typically surrounded by a second insulating material 112 within the bottom layer.

An interlevel of insulating material 114 is disposed between the top layer and the bottom layer for separating the top layer from the bottom layer. A via structure 116 is typically fabricated within the interlevel of insulating material 114. The via structure 116 makes contact with the top metal line 104 and couples the top metal line 104 to another structure within the bottom layer. In FIG. 1A, the via structure 116 contacts a landing pad 118 within the bottom layer.

Referring to FIG. 1A, with proper alignment of the top layer to the bottom layer on the semiconductor wafer 102, the via structure 116 does not connect to the bottom metal line 106. In turn, the top metal line 104 is not connected to the bottom metal line 106 for proper operation of the integrated circuit having the top metal line 104 and the bottom metal line 106.

However, as IC dimensions are further scaled down, misalignment between the top layer, the interlevel of insulating material having the via structure 116, and the bottom layer results in higher probability of undesired overlap and contact between conductive structures. Thus, referring to FIG. 1B, the top layer having the top metal line 104 and the interlevel having the via structure 116 may be misaligned with the bottom layer having the bottom metal line 106 by being shifted too much to the left. As a result, the via structure 116 undesirably makes contact with the bottom metal line 106. In turn, the top metal line 104 is then undesirably connected to the bottom metal line 106 through the via structure 116. Such a short circuit between the top metal line 104 and the bottom metal line 106 may result in an inoperative integrated circuit having the top metal line 104 and the bottom metal line 106.

In addition, as IC dimensions are scaled down, the proximity effect whereby an integrated circuit structure may be fabricated with larger than intended dimensions becomes a greater contributor to undesired connection between the multiple layers of the conductive structures.

Nevertheless, scaling down of IC dimensions is highly desirable. Thus, a mechanism is desired for checking for undesired connection between multiple layers of conductive structures during diagnostic testing of a semiconductor wafer having integrated circuits fabricated thereon. Such a diagnostic determination helps to screen out faulty semiconductor wafers having undesired connection between conductive structures within multiple layers such that time is not wasted on further testing of such faulty semiconductor wafers. Moreover, such a diagnostic determination easily identifies the mechanism causing the integrated circuits to be inoperative such that corrective actions may be taken during fabrication of such integrated circuits.

SUMMARY OF THE INVENTION

Accordingly, the present invention is a device and apparatus for detecting undesired connection between conductive structures within multiple levels on a semiconductor wafer during fabrication of an integrated circuit on the semiconductor wafer.

Generally, the present invention includes a first conductive structure fabricated within the first layer on the semiconductor wafer and a second conductive structure fabricated within the second layer on the semiconductor wafer. The present invention also includes an interlevel of an insulating material disposed between the first layer and the second layer for separating the first layer from the second layer. The present invention further includes a contact structure of conductive material disposed within the interlevel of the insulating material. The contact structure is connected to the first conductive structure. In addition, the present invention includes a detector for determining when the contact structure is undesirably connected to the second conductive structure.

The contact structure is undesirably connected to the second conductive structure from at least one of: sufficient misalignment of at least one of the first layer, the second layer, and the interlevel of insulating material; sufficient proximity effect on at least one of the first conductive structure, the second conductive structure, and the contact structure; and sufficient defects in at least one of the the second layer and the interlevel of insulating material.

In one embodiment of the present invention, the detector for determining when the contact structure is undesirably connected to the second conductive structure includes a voltage generator for applying a voltage between the first conductive structure and the second conductive structure. Furthermore, a current meter measures a current flowing through the first conductive structure and the second conductive structure from the voltage being applied between the first conductive structure and the second conductive structure. This measured current is substantially zero when the contact structure does not make contact with the second conductive structure, and this measured current is greater than zero when the contact structure is undesirably connected to the second conductive structure.

In another embodiment of the present invention, the first conductive structure has a comb structure with a respective contact structure connected to each tooth of the comb structure. In that case, the second conductive structure surrounds the three sides of the respective contact structure. With such a configuration of the first conductive structure and the second conductive structure, misalignment of the first layer with the second layer may be detected for a plurality of directions of misalignment.

These and other features and advantages of the present invention will be better understood by considering the following detailed description of the invention which is presented with the attached drawings.

The figures referred to herein are drawn for clarity of illustration and are not necessarily drawn to scale. Moreover, the figures referred to herein show structures for detecting undesired connection between the top conductive structure and the bottom conductive structure within multiple layers on a semiconductor wafer having other integrated circuits fabricated thereon. Elements having the same reference number in FIGS. 1A, 1B, 2, 3, 4, 5, 6, 7, 8, 9, 10A, 10B, 11, 12, and 13 refer to elements having similar structure and function.

DETAILED DESCRIPTION

Figure 1A:
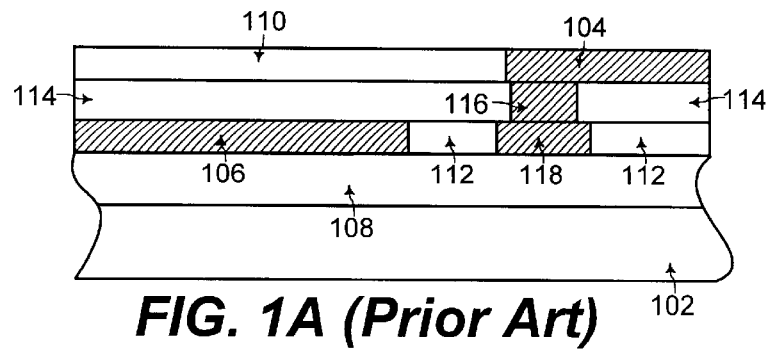
FIG. 1A shows a cross sectional view of a top layer having a top metal line that is properly aligned with a bottom layer having a bottom metal line, on a semiconductor wafer.
Figure 1B:
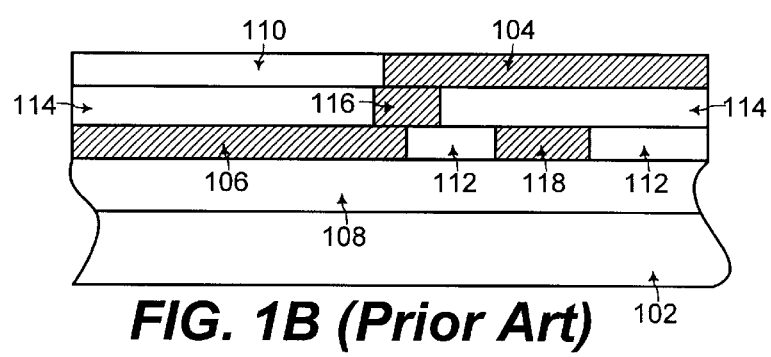
FIG. 1B shows the cross sectional view of FIG. 1A with the top layer having the top metal line being misaligned with the bottom layer having the bottom metal line.
Figure 2:
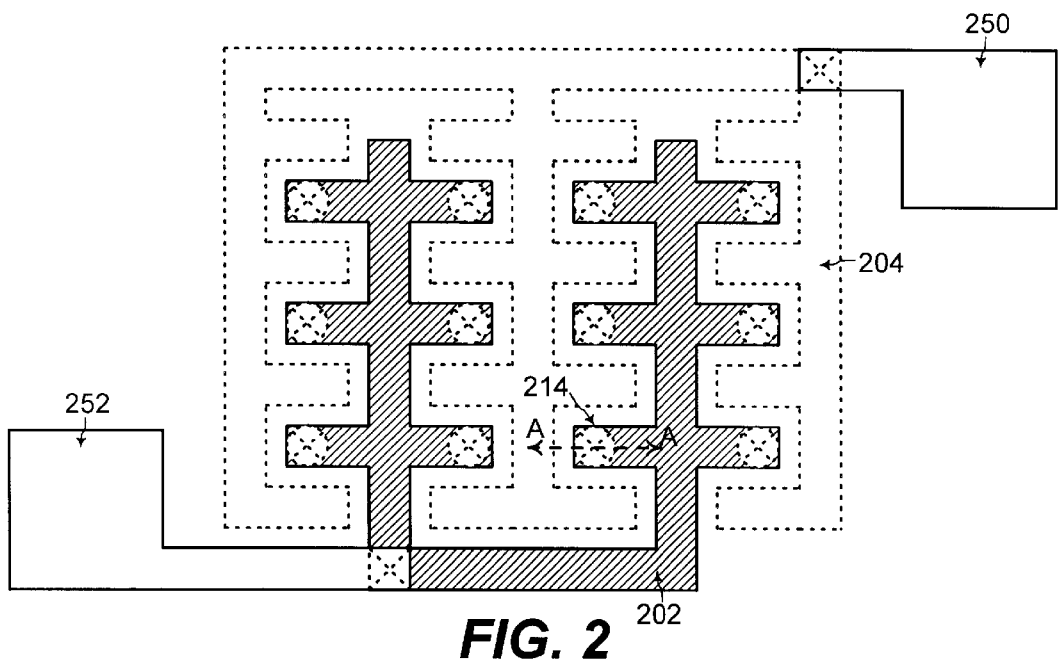
FIG. 2 shows a top view of components of a device of the present invention including a top conductive structure within the top layer and a bottom conductive structure within the bottom layer for detecting undesired connection between the conductive structures within the top layer and the bottom layer.
Figure 3:
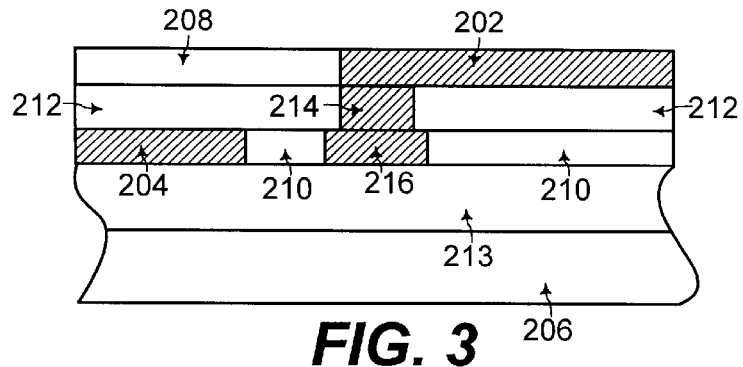
FIG. 3 shows a cross sectional view of a portion of the top conductive structure and the bottom conductive structure of FIG. 2 when the top conductive structure is not connected to the bottom conductive structure.

Referring to FIG. 2, the present invention includes a top conductive structure 202 and a bottom conductive structure 204. Referring to FIGS. 2 and 3, FIG. 3 shows a cross sectional view of a portion of the top conductive structure 202 and the bottom conductive structure 204 across a line AA of FIG. 2. The top conductive structure 202 is fabricated within a top layer on a semiconductor wafer 206. The top conductive structure 202 is typically surrounded by a top insulating material 208 which usually is silicon dioxide when the semiconductor wafer 206 is silicon.

The bottom conductive structure 204 is fabricated within a bottom layer on the semiconductor wafer 206. The bottom conductive structure 204 is also typically surrounded by a bottom insulating material 210 which usually is silicon dioxide when the semiconductor wafer 206 is silicon. Referring to FIG. 2, the border of the bottom conductive structure 204 is shown by dashed lines since the bottom conductive structure 204 is within the bottom layer that is below the top layer having the top conductive structure 202. An interlevel of an insulating material 212 is disposed between the top layer and the bottom layer for separating the top layer and the bottom layer. A layer of insulating material 213 is deposited on the semiconductor wafer 206 and usually is silicon dioxide when the semiconductor wafer 206 is silicon. The bottom layer having the bottom conductive structure 204 is disposed adjacent this layer of insulating material 213.

Referring to FIG. 2, a bottom layer conductive pad 250 is connected to the bottom conductive structure 204 for providing a connection from the bottom conductive structure 204 to a pin that is external to the semiconductor wafer 206. A top layer conductive pad 252 is connected to the top conductive structure 202 for providing a connection from the top conductive structure 202 to a pin that is external to the semiconductor wafer 206.

Referring to FIG. 2, the top conductive structure 202 has a comb structure, and each tooth of the comb structure has a respective contact structure. The contact structures are disposed within the interlevel of the insulating material 212. An example contact structure 214 across a line AA of FIG. 2 is shown in FIG. 3. Each of the contact structures is comprised of a conductive material and contacts the top conductive structure 202 as illustrated in FIG. 3 for the example contact structure 214. (However, note that the present invention may be practiced when the contact structure 214 within the interlevel of the insulating material 212 contacts the bottom conductive structure 204 instead of the top conductive structure 202, as would be apparent to one of ordinary skill the art from the description herein.)

When the top layer having the top conductive structure 202 is properly aligned with the bottom layer having the bottom conductive structure 204 as shown in FIG. 2, the contact structure 214 does not make contact with the bottom conductive structure 204 as illustrated in FIG. 3. Instead, the contact structure 214 contacts a landing pad 216 within the bottom layer on the semiconductor wafer 206. In an alternative embodiment of the present invention, the landing pad 216 may not be present within the bottom layer of the semiconductor wafer 206.

Figure 4:
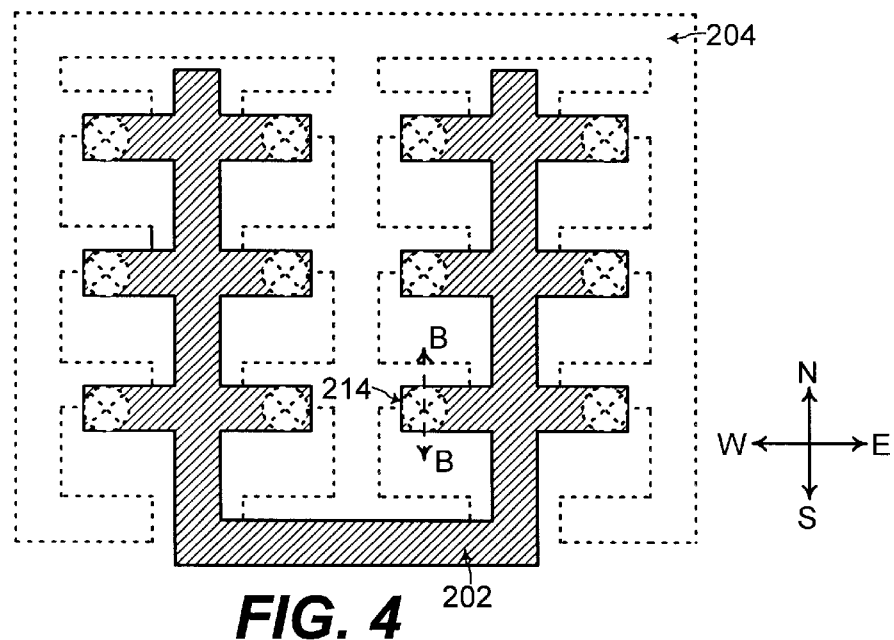
FIG. 4 shows a top view of the components of the device of the present invention when the top conductive structure is misaligned with the bottom conductive structure by being shifted too much in the north direction.

Referring to FIG. 2, the bottom conductive structure 204 surrounds three sides of each of the contact structures. Such a configuration of the top conductive structure 202, the contact structures, and the bottom conductive structure 204 is amenable for detecting sufficient misalignment of at least one of the top layer, the bottom layer, and the interlevel of insulating material 212, in the four directions of north, south, west, and east. Referring to FIG. 4, for example, the top layer having the top conductive structure 202 and the interlevel of insulating material 212 having the contact structures are misaligned with the bottom layer having the bottom conductive structure 204 because the top layer and the interlevel of insulating material 212 are shifted too much in the north direction with respect to the bottom layer. (Note that the bottom layer conductive pad 250 and the top layer conductive pad 252 are not shown in FIG. 4 and the latter figures for clarity of illustration.)

Figure 5:
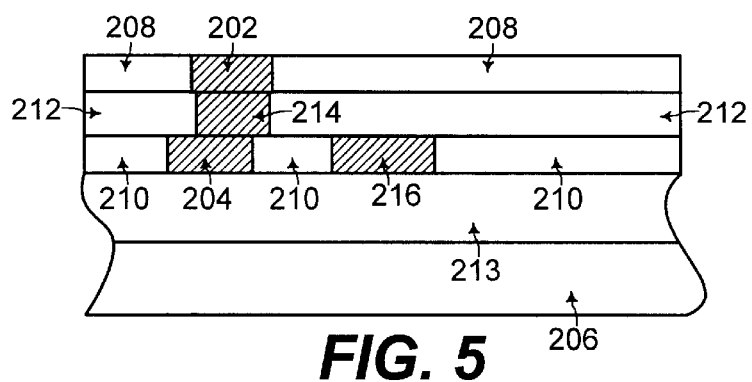
FIG. 5 shows a cross sectional view of a portion of the top conductive structure and the bottom conductive structure of FIG. 4 when the top conductive structure is misaligned with the bottom conductive structure by being shifted too much in the north direction.

Referring to FIGS. 4 and 5, FIG. 5 shows a cross sectional view of a portion of the top conductive structure 202 and the bottom conductive structure 204 across a line BB of FIG. 4. Because of the misalignment of the top layer having the top conductive structure 202 and the interlevel of insulating material 212 having the contact structures with the bottom layer having the bottom conductive structure 204, the contact structures including the example contact structure 214 is undesirably connected to the bottom conductive structure 204. In turn, the top conductive structure 202 is undesirably connected to the bottom conductive structure 204 via the contact structures because of such misalignment.

Figure 6:
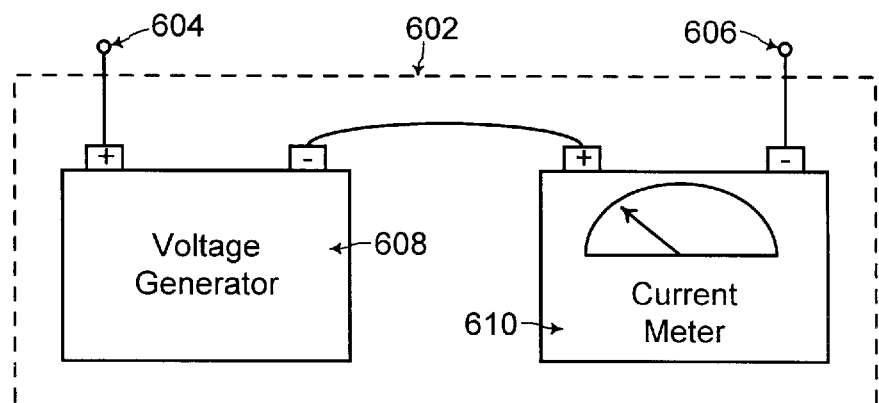
FIG. 6 shows components of the present invention for detecting undesired connection between the top conductive structure and the bottom conductive structure by measuring current flow through the top conductive structure and the bottom conductive structure of the device of the present invention.

Referring to FIG. 6, the present invention includes a detector 602 (shown within dashed lines in FIG. 6) for determining when the contact structures makes undesired contact with the bottom conductive structure 204 such that the top conductive structure 202 is undesirably connected to the bottom conductive structure 204. The detector 602 includes a first node 604 that is connected to the top conductive structure 202 via the top layer conductive pad 252. Similarly, the detector 602 includes a second node 606 that is connected to the bottom conductive structure 204 via the bottom layer conductive pad 250. The detector 602 further includes a voltage generator 608 connected to the top conductive structure 202 via the first node 604 and the bottom conductive structure 204 via the second node 606 for generating a voltage that is applied between the top conductive structure 202 and the bottom conductive structure 204.

The detector 602 also includes a current meter 610 connected in series between the top conductive structure 202 via the first node 604 and the bottom conductive structure 204 via the second node 606. The current meter 610 measures any current flowing through the top conductive structure 202 and the bottom conductive structure 204 from the voltage applied between the top conductive structure 202 and the bottom conductive structure 204 from the voltage generator 608.

Referring to FIGS. 2 and 3, if the top layer having the top conductive structure 202 and the interlevel of insulating material 212 having the contact structures are properly aligned with the bottom layer having the bottom conductive structure 204, then the top conductive structure 202 is not connected to the bottom conductive structure 202. Thus, substantially zero current is measured by the current meter 610 when a voltage is applied between the top conductive structure 202 and the bottom conductive structure 204 by the voltage generator 608.

Referring to FIGS. 4 and 5, if the top layer having the top conductive structure 202 and the interlevel of insulating material 212 having the contact structures are misaligned with the bottom layer having the bottom conductive structure 204, then the top conductive structure 202 is undesirably connected to the bottom conductive structure 204 via the contact structures. Thus, a current level that is greater than zero is measured by the current meter 610 when a voltage is applied between the top conductive structure 202 and the bottom conductive structure 204 by the voltage generator 608.

Referring to FIG. 2, the bottom conductive structure 204 surrounds three sides of each of the contact structures. Such a configuration of the top conductive structure 202, the contact structures, and the bottom conductive structure 204 is amenable for detecting sufficient misalignment of at least one of the top layer, the bottom layer, and the interlevel of insulating material 212 in the four directions of north, south, west, and east.

Figure 7:
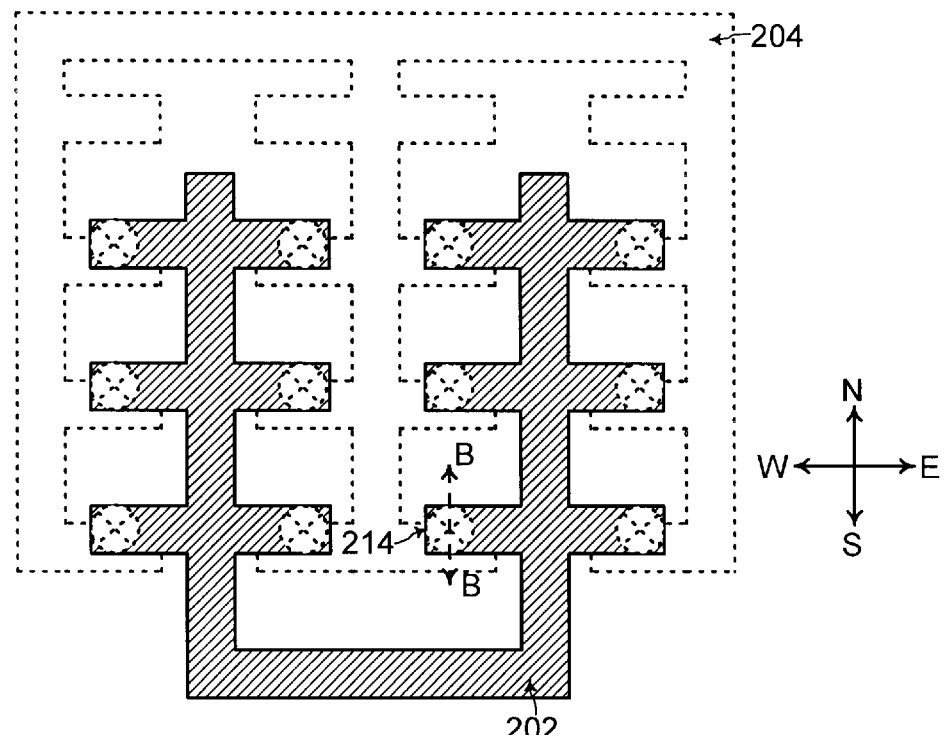
FIG. 7 shows a top view of the components of the device of the present invention when the top conductive structure is misaligned with the bottom conductive structure by being shifted too much in the south direction.

Referring to FIG. 7, the top layer having the top conductive structure 202 and the interlevel of insulating material 212 having the contact structures are misaligned with the bottom layer having the bottom conductive structure 204 because the top layer and the interlevel of insulating material 212 are shifted too much in the south direction with respect to the bottom layer. In this case also, the top conductive structure 202 is connected to the bottom conductive structure 204 via the contact structures, and the current meter 610 measures a current level that is greater than zero when a voltage is applied between the top conductive structure 202 and the bottom conductive structure 204 by the voltage generator 608.

Figure 8:
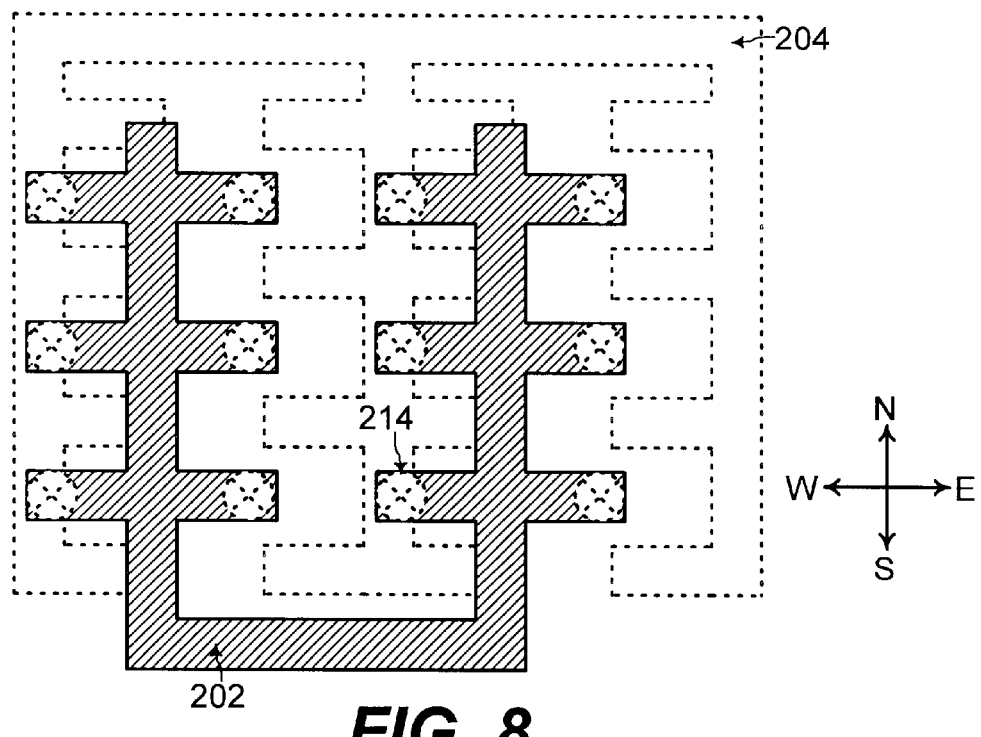
FIG. 8 shows a top view of the components of the device of the present invention when the top conductive structure is misaligned with the bottom conductive structure by being shifted too much in the west direction.

Similarly, referring to FIG. 8, the top layer having the top conductive structure 202 and the interlevel of insulating material 212 having the contact structures are misaligned with the bottom layer having the bottom conductive structure 204 because the top layer and the interlevel of insulating material 212 are shifted too much in the west direction with respect to the bottom layer. In this case also, the top conductive structure 202 is connected to the bottom conductive structure 204 via the contact structures, and the current meter 610 measures a current level that is greater than zero when a voltage is applied between the top conductive structure 202 and the bottom conductive structure 204 by the voltage generator 608.

Figure 9:
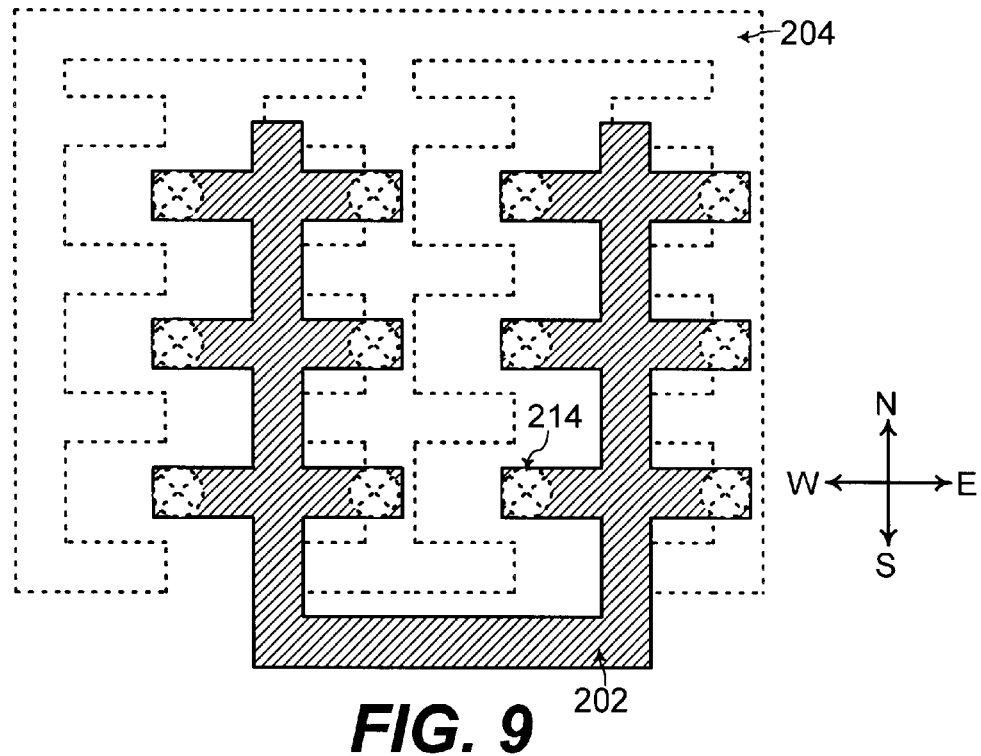
FIG. 9 shows a top view of the components of the device of the present invention when the top conductive structure is misaligned with the bottom conductive structure by being shifted too much in the east direction.

In addition, referring to FIG. 9, the top layer having the top conductive structure 202 and the interlevel of insulating material 212 having the contact structures are misaligned with the bottom layer having the bottom conductive structure 204 because the top layer and the interlevel of insulating material 212 are shifted too much in the east direction with respect to the bottom layer. In this case also, the top conductive structure 202 is connected to the bottom conductive structure 204 via the contact structures, and the current meter 610 measures a current level that is greater than zero when a voltage is applied between the top conductive structure 202 and the bottom conductive structure 204 by the voltage generator 608.

In this manner, connection between the top conductive structure 202 and the bottom conductive structure 204 via the contact structures readily indicates sufficient misalignment of the top layer and the interlevel of insulating material 212 with respect to the bottom layer of structures on a semiconductor wafer in the four directions of north, south, west, or east. Such a diagnostic determination helps to correct undesired misalignment between multiple layers on a semiconductor wafer during fabrication of an integrated circuit. Such a diagnostic determination is especially important as IC (integrated circuit) dimensions are scaled down since misalignment between the multiple layers of conductive structures results in higher probability of undesired overlap and contact between the conductive structures as IC dimensions are further scaled down.

In addition, with such scaling down of IC dimensions, the proximity effect, whereby an integrated circuit structure may be fabricated with larger than intended dimensions, becomes a greater contributor to undesired connection between the multiple layers of the conductive structures. Referring to FIG. 2, for example, the proximity effect may result in larger than intended dimensions for the top conductive structure 202 and/or the bottom conductive structure 204 and/or the contact structures leading to undesired connection between the top conductive structure 202 and the bottom conductive structure 204 via the contact structures, especially when combined with sufficient misalignment of at least one of the top layer, the bottom layer, and the interlevel of insulating material 212. The present invention is also amenable for detecting this undesired connection of the top conductive structure 202 with the bottom conductive structure 204 via the contact structures from such proximity effect, as would be apparent to one of ordinary skill in the art from the description herein.

In some situations, the proximity effect results in larger than intended dimensions for an integrated circuit structure for only a particular dimension. The undesired increase in dimensions may depend on the device geometry (i.e., the density of integrated circuit structures fabricated on the semiconductor wafer) and on the orientation of the device geometry due to lens aberrations during photolithography processes, as known to one of ordinary skill in the art of integrated circuit fabrication.

Figure 10A:
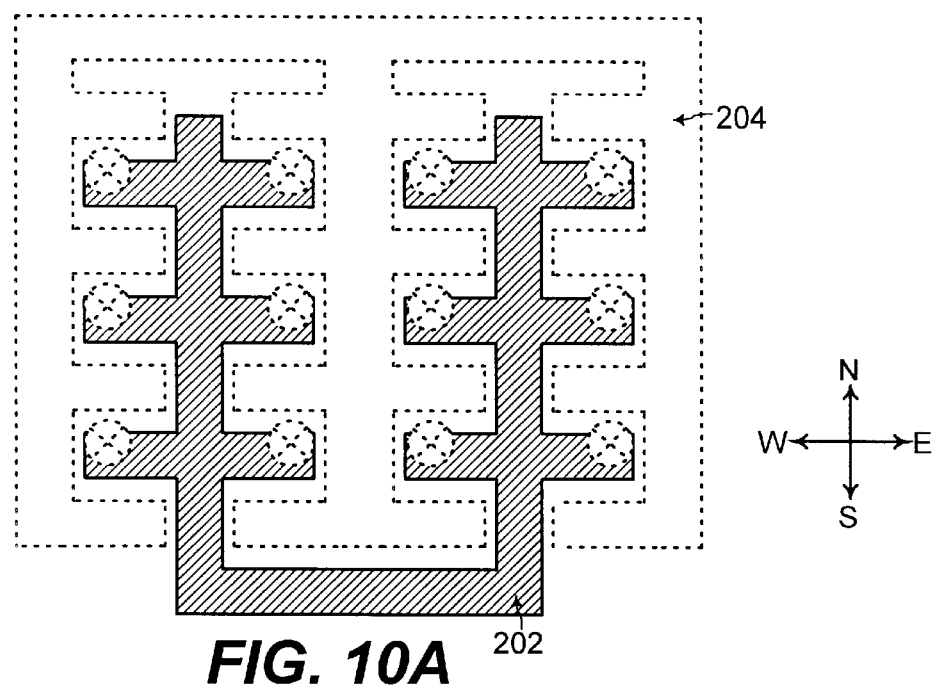
FIG. 10A shows a top view of the components of the device of the present invention of FIG. 2 with the bottom conductive structure having larger than expected dimensions from the proximity effect.

For example, referring to FIGS. 2 and 10A, the bottom conductive structure 204 has wider width dimensions in the west/east directions in FIG. 10A than the intended width dimensions of FIG. 2. In FIG. 10A, the contact structures are also shifted too much in the north direction. Fortunately, even with such an enlarged width dimension of the bottom conductive structure 204 in the west/east directions and the shift of the contact structures in the north direction in FIG. 10A, the bottom conductive structure 204 does not connect to the contact structures in FIG. 10A.

Figure 10B:
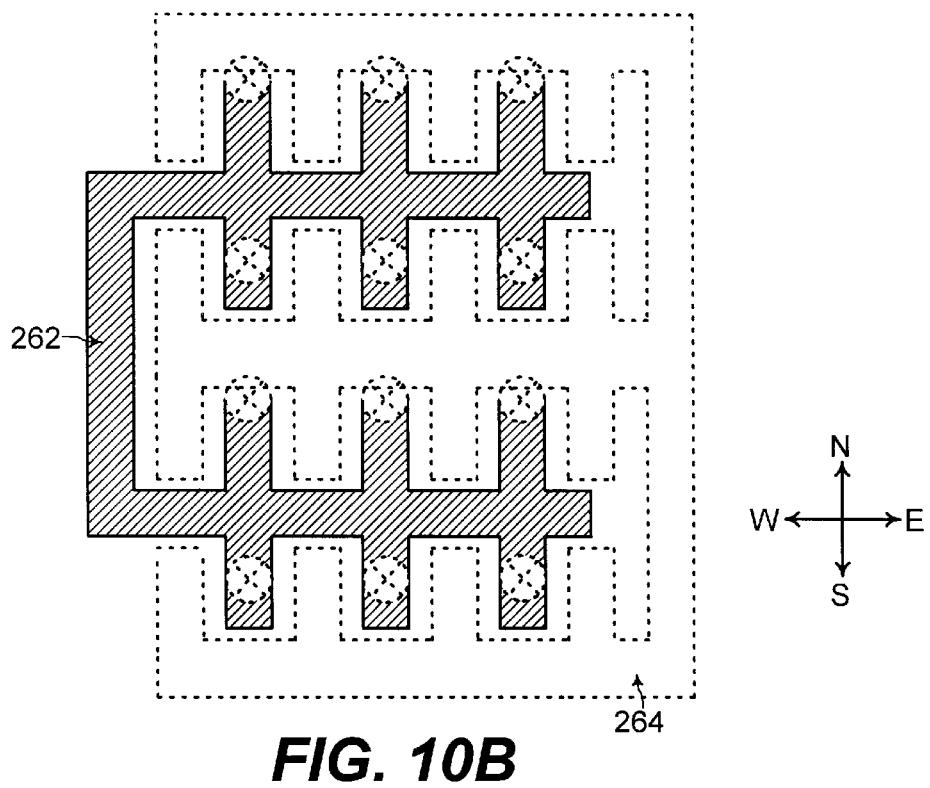
FIG. 10B shows the components of the device of FIG. 10A rotated 90° for detecting undesired connection between the top conductive structure and the bottom conductive structure from the proximity effect.

Referring to FIG. 10B, a rotated top conductive structure 262 is fabricated within the top layer having the top conductive structure 202 of FIG. 10A, and a rotated bottom conductive structure 264 is fabricated within the bottom layer having the bottom conductive structure 204 of FIG. 10A. In FIG. 10B, the contact structures are fabricated within the interlevel insulating layer similar to the contact structures of FIG. 10A. The rotated top conductive structure 262 and the rotated bottom conductive structure 264 of FIG. 10B are the top conductive structure 202 and the bottom conductive structure 204 respectively of FIG. 10A rotated 90°.

Because of the rotation of 90°, the rotated bottom conductive structure 264 of FIG. 10B has wider length dimensions in the north/south directions. Similar to the contact structures of FIG. 10A, the contact structures of FIG. 10B are also shifted too much in the north direction. As a result, the rotated bottom conductive structure 264 of FIG. 10B is undesirably connected to the contact structures and thus with the rotated top conductive structure 262. In order to detect this undesired connection from the proximity effect, the rotated top conductive structure 262 and the rotated bottom conductive structure 264 may be included along with the top conducitve structure 202 and the bottom conductive structure 204 in the device of the present invention.

In this manner, the device of the present invention detects the undesired connection between multiple layers of conductive structures due to both misalignment of the multiple layers and due to the proximity effect.

Moreover, the top conductive structure 202, the bottom conductive structure 204, and the contact structures described herein are fabricated within a semiconductor substrate 206 having an integrated circuit fabricated therein. That integrated circuit is fabricated according to design rules as known to one of ordinary skill in the art of integrated circuit fabrication. The sizes of the top conductive structure 202, the bottom conductive structure 204, and the contact structures and the locations of these structures with respect to one another are also fabricated according to such design rules. Thus, failure of the integrated circuit may be more directly attributed to the misalignment and/or the proximity effect on the conductive structures within multiple layers of the device of the present invention.

Figure 11:
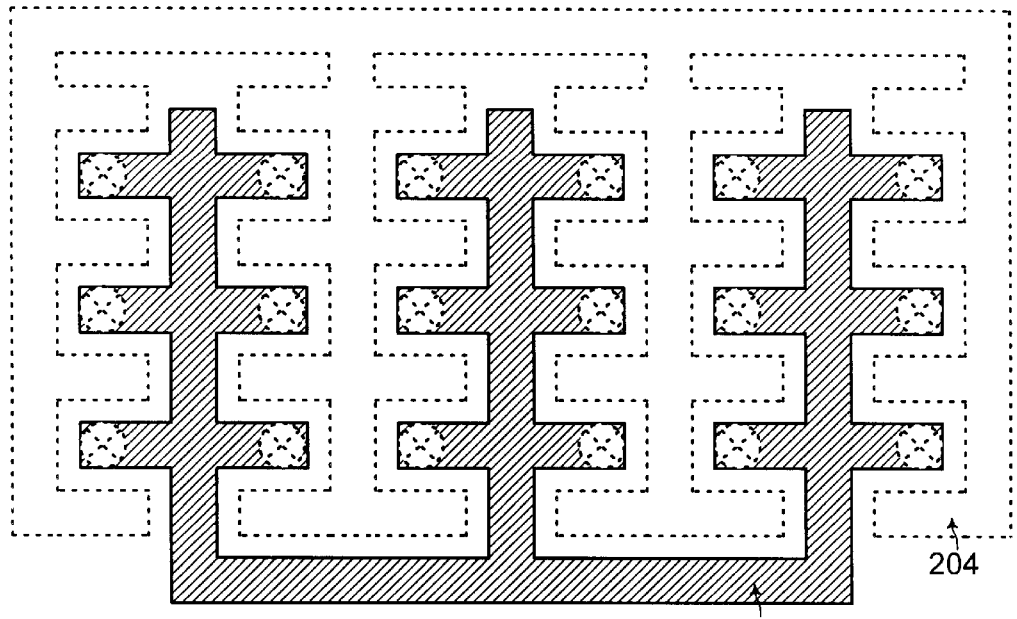
FIG. 11 shows a top view of components of a device of another embodiment of the present invention having a larger number of comb structures than the device of FIG. 2.

The foregoing is by way of example only and is not intended to be limiting. For example, the shape of the top conductive structure 202 and the bottom conductive structure 204 is by way of example only. FIG. 11 shows the top conductive structure. 202 and the bottom conductive structure 204 with a larger number of combs than FIG. 2. The top conductive structure 202 and the bottom conductive structure 204 are constrained to fit within a given area on a semiconductor wafer. In a preferred embodiment of the present invention, the top conductive structure 202 and the bottom conductive structure 204 are designed to have as large a number of combs that fits within such a given area on the semiconductor wafer such that the top conductive structure 202 and the bottom conductive structure 204 occupy as large an area as possible on the semiconductor wafer. Such a design of the top conductive structure 202 and the bottom conductive structure 204 ensures that the device of the present invention also detects for undesired connection between the top conductive structure 202 and the bottom conductive structure 204 due to any defects on the semiconductor wafer.

Figure 12:
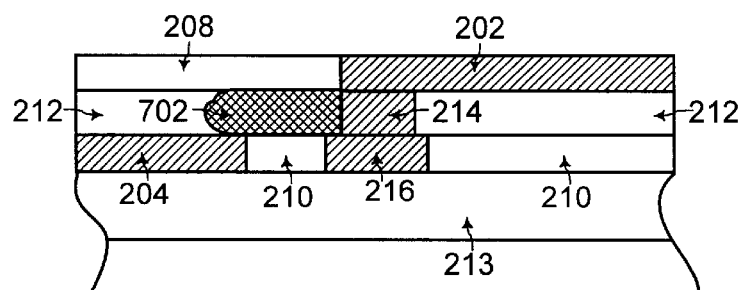
FIG. 12 shows the cross sectional view of FIG. 3 further including sufficient defect, within the interlevel of insulating material, that results in undesired connection between the top conductive structure and the bottom conductive structure.
Figure 13:
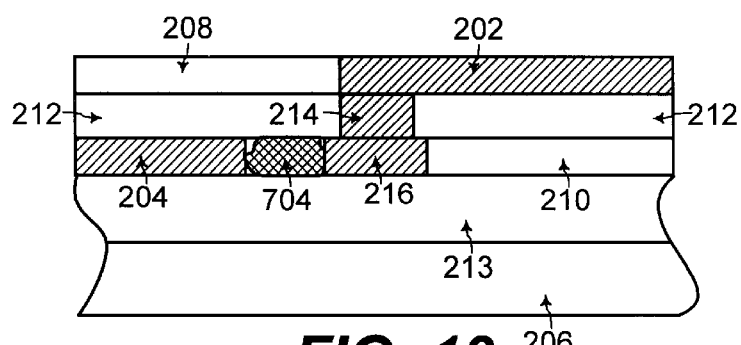
FIG. 13 shows the cross sectional view of FIG. 3 further including sufficient defect, within the bottom layer, that results in undesired connection between the top conductive structure and the bottom conductive structure.

Referring to FIG. 12, for example, a sufficient defect 702 within the interlevel of insulating material 212 results in undesired connection between the contact structure 214 and the bottom conductive structure 204. Similarly, referring to FIG. 13, a sufficient defect 704 within the bottom layer results in undesired connection between the contact structure 214 and the bottom conductive structure 204. The device of the present invention detects such undesired connection between the contact structure 214 and the bottom conductive structure 204 that results from such defects within at least one of the interlevel of insulating material 212 and the bottom layer.

Typically, the percentage of failing structures on a semiconductor wafer indicates the yield loss due to defects on the wafer. As device geometries are scaled down, sufficient misalignment between conductive structures on multiple levels of the semiconductor wafer further enhances the detrimental effects of defects thus increasing the yield loss. In addition, the proximity effect on the conductive structures on multiple levels of the semiconductor wafer also enhances the detrimental effects of defects thus increasing the yield loss. The device of the present invention may be used for detecting the undesired connection between conductive structures within multiple layers of the semiconductor wafer from any combination of: sufficient misalignment of at least one of the top layer, the bottom layer, and the interlevel of insulating material; sufficient proximity effect on the top conductive structure, the bottom conductive structure, and the contact structures; and sufficient defects within the bottom layer and the interlevel of insulating material, as would be apparent to one of ordinary skill in the art from the description herein.

Other configurations of conductive structures on the top layer and the bottom layer may be used to practice the present invention, as would be apparent to one of ordinary skill in the art from the description herein. In addition, the present invention may be practiced with the conductive structures 202, 204, 262, and 264 being comprised of any conductive material, such as for example, metal, polysilicon, local interconnect, or a conductive active region within the semiconductor substrate, that one of ordinary skill in the art may know how to fabricate on the semiconductor wafer.

Furthermore, as will be understood by those skilled in the art, the integrated circuit structures described herein may be made or used in the same way regardless of their position and orientation. Accordingly, it is to be understood that terms and phrases such as "top," "bottom," "left," "below," "north," "south," "west," "east," "width," and "length" as used herein refer to the relative location and orientation of various portions of the structures with respect to one another, and are not intended to suggest that any particular absolute orientation with respect to external objects is necessary or required. The invention is limited only as defined in the following claims and equivalents thereof.

I claim:

1. A method for detecting undesired connection between conductive structures within multiple layers on a semiconductor wafer during fabrication of an integrated circuit on said semiconductor wafer, said method including steps of:

A. fabricating a first conductive structure within a first layer on said semiconductor wafer, and forming said first conductive structure to have a comb structure with a plurality of teeth;

B. fabricating a second conductive structure within a second layer on said semiconductor wafer, and forming said second conductive structure to surround three sides of each of said plurality of teeth of said comb structure of said first conductive structure;

C. fabricating an interlevel of an insulating material disposed between said first layer and said second layer for separating said first layer from said second layer;

wherein said first layer, said second layer, and said interlevel of insulating material are comprised of three separate levels of insulating material with said first conductive structure being formed within a first level of insulating material, said second conductive structure being formed within a second level of insulating material, and said interlevel of insulating material being disposed between said first and second levels of insulating material;

D. fabricating a plurality of contact structures of conductive material formed within said interlevel of said insulating material, and forming each of said plurality of contact structures to be connected to a respective one of said plurality of teeth of said first conductive structure; and E. detecting when any of said plurality of contact structures is undesirably connected to any portion of said second conductive structure when said first conductive structure is misaligned with respect to said second conductive structure in any of a plurality of dimensions.

2. The method of claim 1, wherein said contact structure is undesirably connected to said second conductive structure from at least one of: sufficient misalignment of at least one of said first layer, said second layer, and said interlevel of insulating material; sufficient proximity effect on at least one of said first conductive structure, said second conductive structure, and said contact structure; and sufficient defects in at least one of said second layer and said interlevel of insulating material.

3. The method of claim 1, wherein said first conductive structure is a top conductive structure disposed within the first layer that is a top layer disposed further away from said semiconductor wafer than said second conductive structure that is a bottom conductive structure disposed within the second layer that is a bottom layer disposed closer to said semiconductor wafer.

4. The method of claim 1, wherein said second conductive structure is a top conductive structure disposed within the second layer that is a top layer that is disposed further away from said semiconductor wafer than said first conductive structure that is a bottom conductive structure disposed within the first layer that is a bottom layer disposed closer to said semiconductor wafer.

5. The method of claim 1, wherein said step E further includes steps of:

applying a voltage between said first conductive structure and said second conductive structure; and measuring a current flowing through said first conductive structure and said second conductive structure from said voltage being applied between said first conductive structure and said second conductive structure;

and wherein said current is substantially zero when said contact structure is not connected to said second conductive structure;

and wherein said current is greater than zero when said contact structure is undesirably connected to said second conductive structure.

6. The method of claim 1, further including steps of:

fabricating a third conductive structure within said first layer on said semiconductor wafer, said third conductive structure being a copy of said first conductive structure that is rotated 90°;

fabricating a fourth conductive structure within said second layer on said semiconductor wafer, said fourth conductive structure being a copy of said second conductive structure that is rotated 90°;

fabricating a second contact structure of conductive material disposed within said interlevel of said insulating material, said second contact structure being connected to said third conductive structure; and detecting when said second contact structure is undesirably connected to said fourth conductive structure.

7. The method of claim 1, wherein said first conductive structure is comprised of a selected one of metal, polysilicon, local interconnect, and a conductive active region within said semiconductor wafer, and wherein said second conductive structure is comprised of a selected one of metal, polysilicon, local interconnect and a conductive active region within said semiconductor wafer.

8. A method for detecting undesired connection between conductive structures within multiple layers on a semiconductor wafer during fabrication of an integrated circuit on said semiconductor wafer, said method including steps of:

A. fabricating a first conductive structure within a first layer on said semiconductor wafer, and forming said first conductive structure to have a comb structure with a plurality of teeth;

B. fabricating a second conductive structure within a second layer on said semiconductor wafer, and forming said second conductive structure to surround three sides of each of said plurality of teeth of said comb structure of said first conductive structure;

C. fabricating an interlevel of an insulating material disposed between said first layer and said second layer for separating said first layer from said second layer;

wherein said first layer, said second layer, and said interlevel of insulating material are comprised of three separate levels of insulating material with said first conductive structure being formed within a first level of insulating material, said second conductive structure being formed within a second level of insulating material, and said interlevel of insulating material being disposed between said first and second levels of insulating material;

D. fabricating a plurality of contact structures of conductive material formed within said interlevel of said insulating material, and forming each of said plurality of contact structures to be connected to a respective one of said plurality of teeth of said first conductive structure; and E. detecting when any of said plurality of contact structures is undesirably connected to any portion of said second conductive structure when said first conductive structure is misaligned with respect to said second conductive structure in any of a plurality of dimensions, wherein said step E further includes steps of:

applying a voltage between said first conductive structure and said second conductive structure; and measuring a current flowing through said first conductive structure and said second conductive structure from said voltage being applied between said first conductive structure and said second conductive structure;

and wherein said current is substantially zero when said contact structure is not connected to said second conductive structure;

and wherein said current is greater than zero when said contact structure is undesirably connected to said second conductive structure;

and wherein said contact structure is undesirably connected to said second conductive structure from at least one of: sufficient misalignment of at least one of said first layer, said second layer, and said interlevel of insulating material; sufficient proximity effect on at least one of said first conductive structure, said second conductive structure, and said contact structure; and sufficient defects in at least one of said second layer and said interlevel of insulating material;

and wherein said first conductive structure is a top conductive structure disposed within the first layer that is a top layer disposed further away from said semiconductor wafer than said second conductive structure that is a bottom conductive structure disposed within the second layer that is a bottom layer disposed closer to said semiconductor wafer;

and wherein said first conductive structure is comprised of a selected one of metal, polysilicon, local interconnect, and a conductive active region within said semiconductor wafer, and wherein said second conductive structure is comprised of a selected one of metal, polysilicon, local interconnect and a conductive active region within said semiconductor wafer.

* * * * *